(12) United States Patent
Berkley et al.

(10) Patent No.: US 9,355,365 B2
(45) Date of Patent: May 31, 2016

(54) SYSTEMS AND METHODS FOR SUPERCONDUCTING INTEGRATED CIRCUITS

(71) Applicant: D-WAVE SYSTEMS INC., Burnaby (CA)

(72) Inventors: Andrew J. Berkley, Vancouver (CA); Mark W. Johnson, Vancouver (CA); Paul I. Bunyk, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 229 days.

(21) Appl. No.: 14/255,561

(22) Filed: Apr. 17, 2014

(65) Prior Publication Data

US 2014/0228222 A1 Aug. 14, 2014

Related U.S. Application Data

(63) Continuation of application No. 12/944,518, filed on Nov. 11, 2010, now Pat. No. 8,738,105.

(60) Provisional application No. 61/295,561, filed on Jan. 15, 2010.

(51) Int. Cl.
*H01L 39/00* (2006.01)
*G06N 99/00* (2010.01)
*B82Y 10/00* (2011.01)
(Continued)

(52) U.S. Cl.
CPC .............. *G06N 99/002* (2013.01); *B82Y 10/00* (2013.01); *H01L 23/53285* (2013.01); *H01L 27/18* (2013.01); *H01L 2924/0002* (2013.01)

(58) Field of Classification Search
CPC .............. H01L 23/53285; H01L 27/18; H01L 2924/0002; B82Y 10/00
See application file for complete search history.

(56) References Cited

U.S. PATENT DOCUMENTS 5,095,357 A 3/1992 Andoh et al.
5,465,049 A 11/1995 Matsuura et al.
(Continued)

FOREIGN PATENT DOCUMENTS

JP 6-140679 A 5/1994
JP 2005-142348 A 6/2005
(Continued)

OTHER PUBLICATIONS

Extended European Search Report, for Patent Application No. 11733453.2, dated Jul. 1, 2014, 6 pages.
(Continued)

*Primary Examiner* — Colleen Dunn
(74) *Attorney, Agent, or Firm* — Seed IP Law Group PLLC

(57) ABSTRACT

A superconducting integrated circuit may include a magnetic flux transformer having an inner inductive coupling element and an outer inductive coupling element that surrounds the inner inductive coupling element along at least a portion of a length thereof. The magnetic flux transformer may have a coaxial-like geometry such that a mutual inductance between the first inductive coupling element and the second inductive coupling element is sub-linearly proportional to a distance that separates the first inner inductive coupling element from the first outer inductive coupling element. At least one of the first inductive coupling element and the second inductive coupling element may be coupled to a superconducting programmable device, such as a superconducting qubit.

19 Claims, 13 Drawing Sheets

(51) Int. Cl.
*H01L 23/532* (2006.01)
*H01L 27/18* (2006.01)

(56) References Cited

U.S. PATENT DOCUMENTS

| | | | | |
|---|---|---|---|---|
| 5,523,914 | A * | 6/1996 | Weck | H01F 6/006 |
| | | | | 323/360 |
| 5,962,781 | A * | 10/1999 | Veryaskin | G01V 7/005 |
| | | | | 73/382 G |
| 6,037,649 | A | 3/2000 | Liou | |
| 7,533,068 | B2 | 5/2009 | Maassen van den Brink et al. | |
| 2002/0190381 | A1* | 12/2002 | Herr | H01L 27/18 |
| | | | | 257/758 |
| 2005/0127915 | A1* | 6/2005 | Schauwecker | H01F 6/008 |
| | | | | 324/318 |
| 2005/0140019 | A1 | 6/2005 | Watanabe | |
| 2006/0043541 | A1 | 3/2006 | Tetelbaum | |
| 2008/0176750 | A1 | 7/2008 | Rose et al. | |
| 2008/0238531 | A1 | 10/2008 | Harris | |
| 2009/0121215 | A1 | 5/2009 | Choi | |

FOREIGN PATENT DOCUMENTS

| | | |
|---|---|---|
| JP | 2007-250771 A | 9/2007 |
| JP | 2009-65017 A | 3/2009 |
| JP | 2010-524064 A | 7/2010 |
| WO | 2004/077600 A1 | 9/2004 |
| WO | 2009/120638 A2 | 10/2009 |

OTHER PUBLICATIONS

International Search Report, mailed Sep. 26, 2011, for PCT/US2011/021331, 3 pages.
Written Opinion, mailed Sep. 26, 2011, for PCT/US2011/021331, 4 pages.
Blatter et al., "Design aspects of superconducting-phase quantum bits," *Physical Review B* 63:174511-1-174511-9, 2001.
Friedman et al., "Quantum superposition of distinct macroscopic states," *Nature* 406:43-46, Jul. 6, 2000.
Il'ichev et al., "Continuous Monitoring of Rabi Oscillations in a Josephson Flux Qubit," *Physical Review Letters* 91(9):097906-1-097906-4, week ending Aug. 29, 2003.
Makhlin et al., "Quantum-State Engineering with Josephson-Junction Devices," *Reviews of Modern Physics* 73(2):357-400, Apr. 2001.
Mooij et al., "Josephson Persistent-Current Qubit," *Science* 285:1036-1039, Aug. 13, 1999.
Orlando et al., "Superconducting Persistent-Current Qubit," *Physical Review B* 60(22):15 398-15 413, Dec. 1, 1999.
Japanese Office Action with English Translation, dated Aug. 25, 2014, for corresponding JP Application No. 2012-549120, 4 pages.

* cited by examiner

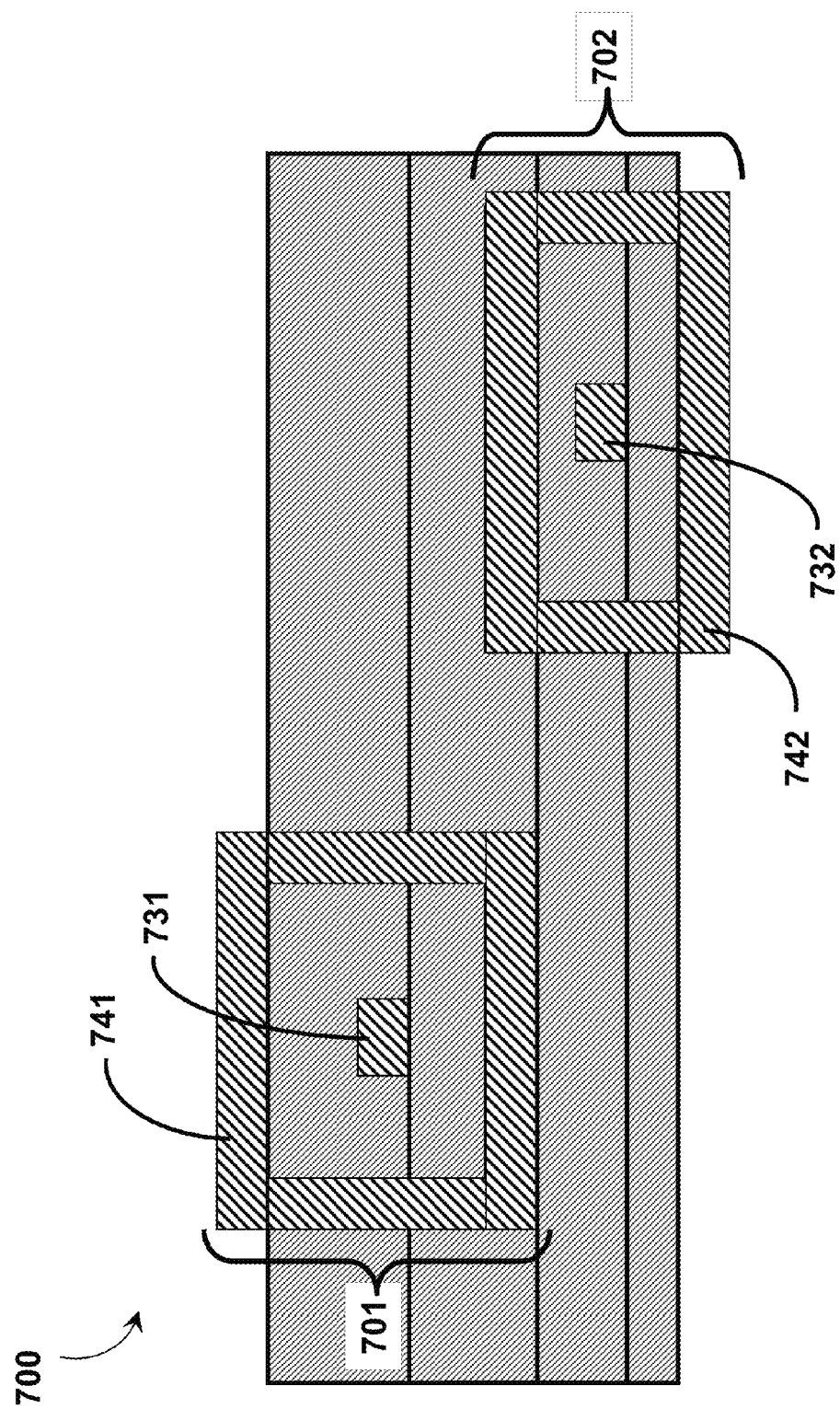

SYSTEMS AND METHODS FOR SUPERCONDUCTING INTEGRATED CIRCUITS

BACKGROUND

1. Field

The present systems and methods generally relate to superconducting integrated circuits and particularly relate to mitigating unwanted discrepancies in mutual inductance between elements of a superconducting integrated circuit.

2. Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, they may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Many different forms of superconducting flux qubits have been implemented in the art, but all successful implementations generally include a superconducting loop (i.e., a "qubit loop") that is interrupted by at least one Josephson junction. Some embodiments implement multiple superconducting loops connected in series and/or in parallel with one another. Some embodiments implement multiple Josephson junctions connected either in series or in parallel with one another. In the art, a pair of Josephson junctions that are connected in parallel with one another is known as a compound Josephson junction ("CJJ").

Quantum Processor

A computer processor may take the form of a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems and methods are described in U.S. Pat. No. 7,533,068, US Patent Publication 2008-0176750, US Patent Publication 2009-0121215, and PCT Patent Application Serial No. PCT/US2009/037984 (Publication WO2009/120638).

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

BRIEF SUMMARY

At least one embodiment may be summarized as a superconducting integrated circuit including a first superconducting current path disposed in a first metal layer; a first dielectric layer, at least a portion of which is carried on the first metal layer; a second superconducting current path disposed in a second metal layer that is carried on the first dielectric layer, wherein at least a portion of the second superconducting current path overlies at least a portion of the first superconducting current path; a second dielectric layer, at least a portion of which is carried on the second metal layer; a third superconducting current path disposed in a third metal layer that is carried on the second dielectric layer, wherein at least a portion of the third superconducting current path overlies at least a portion of both the first and second superconducting current paths; a first superconducting connection between the first superconducting current path and the third superconducting current path, wherein the first superconducting connection extends through both the first dielectric layer and the second dielectric layer; and a second superconducting connection between the first superconducting current path and the third superconducting current path, wherein the second superconducting connection extends through both the first dielectric layer and the second dielectric layer, and wherein at least a portion of the second superconducting current path is encircled by an outer superconducting current path formed by at least a portion of the first superconducting current path, at least a portion of the second superconducting current path, and the first and second superconducting connections, and wherein the second superconducting current path is configured to inductively couple a signal to the outer superconducting current path. In some embodiments, a mutual inductance between the second superconducting current path and the outer superconducting current path may be sub-linearly proportional to a thickness of the first dielectric layer and a thickness of the second dielectric layer. The first and the second superconducting connections may each include at least one respective superconducting via. In some embodiments, the second superconducting current path may be a portion of an input signal line and both the first and the third superconducting current paths may be coupled to a superconducting programmable device. In other embodiments, the second superconducting current path may be a portion of a superconducting programmable device and both the first and the third superconducting current paths may be coupled to an input signal line. The superconducting programmable device may be a superconducting qubit.

At least one embodiment may be summarized as a superconducting integrated circuit including a first superconducting current path carried in a first metal layer in a first xy-plane; a second superconducting current path carried in a second metal layer in a second xy-plane, wherein the second superconducting current path overlies the first superconducting current path; a first and a second superconducting connection between the first and the second superconducting current paths, wherein the first superconducting current path, the second superconducting current path, and the first and the second superconducting connections together form a closed superconducting loop in an xz-plane, the xz-plane being orthogonal to the first and the second xy-planes, and wherein the closed superconducting loop defines an enclosed area in the xz-plane; and a third superconducting current path carried in a third metal layer in a third xy-plane, the third xy-plane being positioned in between the first and the second xy-planes such that the third metal layer is positioned in between the first and the second metal layers, wherein a length of the third superconducting current path extends in the third xy-plane through the enclosed area defined in the xz-plane, and wherein the third superconducting current path is configured to inductively couple a signal to the closed superconducting loop. For example, the third superconducting current path is communicatively coupleable to the closed superconducting loop via an inductive coupling. In some embodiments, a mutual inductance between the third superconducting current path and the closed superconducting loop may be sub-linearly proportional to a distance separating the third superconducting current path from a perimeter of the closed superconducting loop. The first and the second superconducting connections may each include at least one respective superconducting via. In some embodiments, the third superconducting current path may be a portion of an input signal line and both the first and the second superconducting current paths may be coupled to a superconducting programmable device. In other embodiments, the third superconducting current path may be a portion of a superconducting programmable device and both the first and the second superconducting current paths may be coupled to an input signal line. The superconducting programmable device may be a superconducting qubit.

At least one embodiment may be summarized as a superconducting integrated circuit including a first inductive coupling element comprising an inner superconductor disposed in a first metal layer, wherein the first metal layer is positioned in between two dielectric layers; and a second inductive coupling element comprising an outer superconductor that encircles the inner superconductor along at least a portion of a length thereof, wherein the outer superconductor is formed by two coplanar superconductors respectively disposed in a second metal layer and a third metal layer and at least two superconducting connections between the two coplanar superconductors, and wherein the outer superconductor is spatially separated from the inner superconductor by the two dielectric layers. A mutual inductance between the first inductive coupling element and the second inductive coupling element may be sub-linearly dependent on a respective thickness of each of the two dielectric layers. In some embodiments, the first inductive coupling element may be a portion of an input signal line and the second inductive coupling element may be coupled to a superconducting programmable device. In other embodiments, the first inductive coupling element may be a portion of a superconducting programmable device and the second inductive coupling element may be coupled to an input signal line. The superconducting programmable device may be a superconducting qubit. The at least two superconducting connections may each include at least one respective superconducting via.

At least one embodiment may be summarized as a superconducting integrated circuit including a first inductive coupling element comprising a first superconducting current path disposed in a first metal layer that is positioned in between two dielectric layers; a second inductive coupling element comprising a second superconducting current path disposed in a second metal layer, a third superconducting current path disposed in a third metal layer, and at least two superconducting connections between the second and the third superconducting current paths such that the second inductive coupling element encircles the first inductive coupling element along at least a portion of a length thereof; and a first superconducting programmable device. A mutual inductance between the first inductive coupling element and the second inductive coupling element may be sub-linearly proportional to a distance separating the first inductive coupling element and the second inductive coupling element. The at least two superconducting connections may each include at least one respective superconducting via. The first superconducting programmable device may include a superconducting qubit. In some embodiments, the first inductive coupling element may include a portion of an input signal line and the second inductive coupling element may be coupled to the first superconducting programmable device. In other embodiments, the first inductive coupling element may be coupled to the first superconducting programmable device and the second inductive coupling element may be coupled to an input signal line. In some embodiments, the superconducting integrated circuit may include a third inductive coupling element comprising a fourth superconducting current path disposed in the first metal layer that is positioned in between two dielectric layers; a fourth inductive coupling element comprising a fifth superconducting current path disposed in the second metal layer, a sixth superconducting current path disposed in the third metal layer, and at least two superconducting connections between the fifth and sixth superconducting current paths such that the fourth inductive coupling element encircles at least a portion of the third inductive coupling element; and a second superconducting programmable device. The third inductive coupling element may include a portion of an input signal line and the fourth inductive coupling element may be coupled to the second superconducting programmable device. Alternatively, the third inductive coupling element may be coupled to the second superconducting programmable device and the fourth inductive coupling element may be coupled to an input signal line. The first inductive coupling element may be galvanically coupled to the third inductive coupling element. The second inductive coupling element may be galvanically coupled to the fourth inductive coupling element.

At least one embodiment may be summarized as an integrated circuit including a plurality of electrically conductive layers and electrically insulative layers including at least a first inner inductive coupling element that is electrically conductive and at least a first outer inductive coupling element that is electrically conductive, wherein the first outer inductive coupling element extends through multiple ones of the electrically conductive and electrically insulative layers to surround the first inner inductive coupling element along at least a portion of a length thereof, and wherein the first outer inductive coupling element is electrically insulated from the first inner inductive coupling element and spaced sufficiently close thereto to provide inductive communications therebetween. In some embodiments, at least one of the first inner inductive coupling element and the first outer inductive coupling element may be formed of an electrically conductive material that is superconducting below a critical temperature. At least one of the first inner inductive coupling element and the first outer inductive coupling element may be coupled to a superconducting programmable device. A mutual inductance between the first inner inductive coupling element and the first outer inductive coupling element may be sub-linearly proportional to a distance that separates the first inner inductive coupling element from the first outer inductive coupling element. In some embodiments, the integrated circuit may include a second outer inductive coupling element that is electrically conductive, wherein the second outer inductive coupling element extends through multiple ones of the electrically conductive and electrically insulative layers to surround the first inner inductive coupling element along at least a portion of a length thereof, and wherein the second outer inductive coupling element is electrically insulated from the first inner inductive coupling element and spaced sufficiently close thereto to provide inductive communications therebetween, and wherein the second outer inductive coupling element is galvanically coupled to the first outer inductive coupling element.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 7 shows a sectional view of an exemplary superconducting integrated circuit employing two coaxial flux transformers.

DETAILED DESCRIPTION

Figure 1:
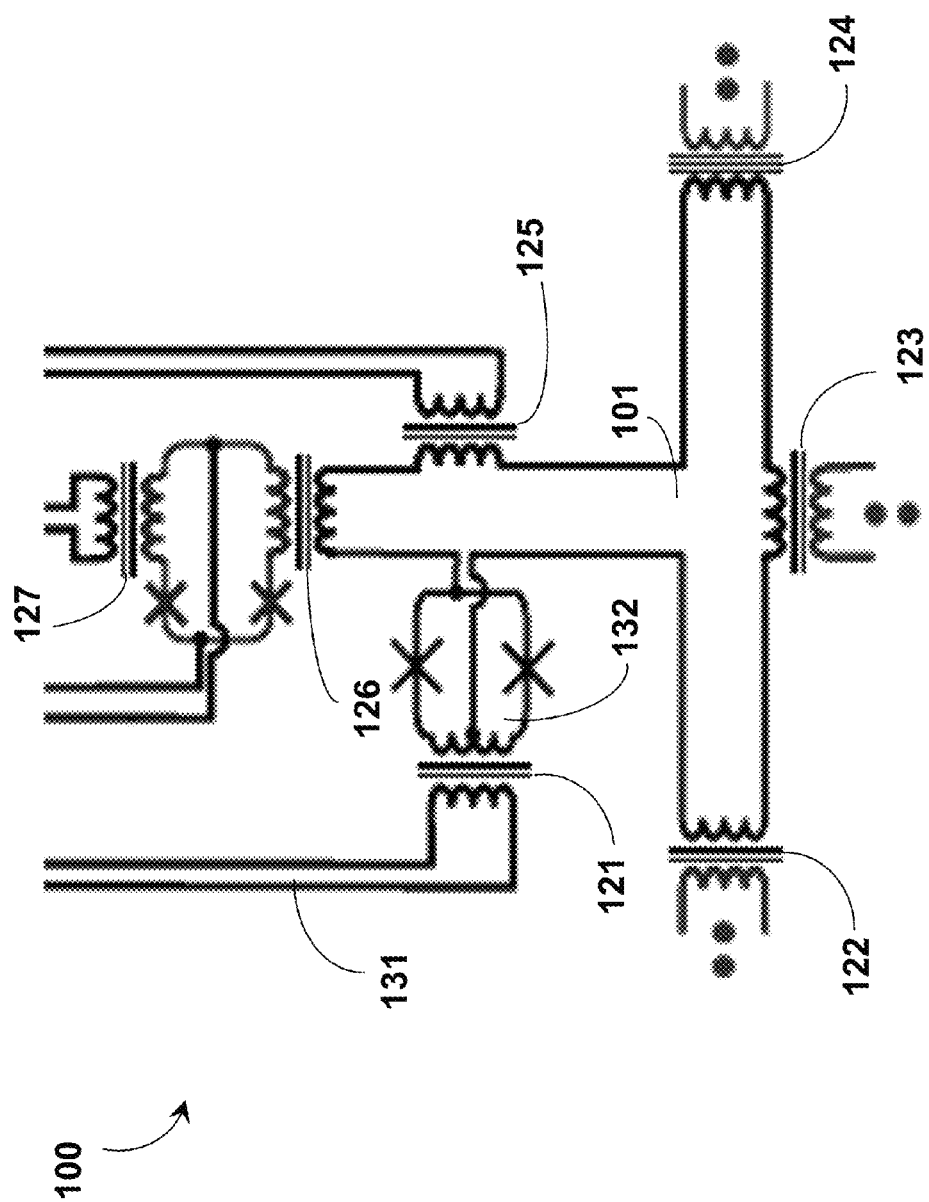
FIG. 1 is a schematic diagram of a superconducting integrated circuit comprising a superconducting flux qubit with several inductive couplings.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments of the present systems and methods. Throughout this specification and the appended claims, the words "element" and "elements" are used to encompass, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The various embodiments described herein provide systems and methods for mitigating discrepancies in mutual inductance between elements of a superconducting integrated circuit. As an example, such discrepancies may be a result of imperfections in the fabrication process. The present systems and methods may be applied in any integrated circuit and are particularly useful in a superconducting integrated circuit embodying a superconducting processor, such as a superconducting quantum processor. Throughout the remainder of this specification, applications in the field of superconducting quantum computing are described for exemplary purposes while those of skill in the art will appreciate that the teachings herein are not limited to applications in quantum computing.

Many superconducting integrated circuits employ inductive coupling between devices as a means of signal transfer. Such inductive coupling is typically achieved through a magnetic flux transformer formed by two electrically-isolated "inductive coupling elements." In common practice, the inductive coupling elements are superconducting inductors positioned sufficiently proximate one another to establish a mutual inductance therebetween. An example of the use of inductive coupling as a means of signal transfer in a superconducting integrated circuit is illustrated in FIG. 1.

FIG. 1 is a schematic diagram of a superconducting integrated circuit 100 comprising a superconducting flux qubit 101 with several inductive couplings 121-127. Each inductive coupling 121-127 is realized through a respective flux transformer comprising a pair of superconducting inductors positioned sufficiently proximate one another to establish a mutual inductance therebetween. Each of inductive couplings 121-127 provides a means of signal transfer that is necessary for the operation of superconducting integrated circuit 100. For example, inductive coupling 121 provides a means of signal transfer between input signal line 131 and CJJ 132. Those of skill in the art will appreciate that the strength of the mutual inductance achieved between input signal line 131 and CJJ 132 may depend on a variety of factors, including, for example, the size of the gap that separates the two inductors. If superconducting integrated circuit 100 is designed with the intention that this mutual inductance be characterized by a specific and precise value, then the circuit needs to be fabricated by a precise process to achieve that value. A variation or discrepancy in the fabrication process may result in an unwanted discrepancy between the intended value of the mutual inductance and the actual value achieved. Thus, the mutual inductance that is realized in each of inductive couplings 121-127 is dependent, at least in part, on the process by which superconducting integrated circuit 100 is fabricated.

In many applications the actual mutual inductance achieved in a fabricated circuit does not need to precisely match the nominal value to which it was designed. For example, in some applications it may be possible to characterize the actual value of the mutual inductance realized between two inductive coupling elements (e.g., by performing preliminary measurements) and then to accommodate any variation from the designed nominal value by scaling an applied signal accordingly. However, in some applications it can be advantageous to mitigate the effects of any discrepancy between the actual value and the designed nominal value of a mutual inductance, and/or to mitigate any drift or inconsistency in the mutual inductances achieved across a superconducting integrated circuit employing multiple mutual inductances. An example of an application for which such mitigation is advantageous is a superconducting integrated circuit that includes multiple elements inductively coupled to receive a signal from the same signal source.

Figure 2:
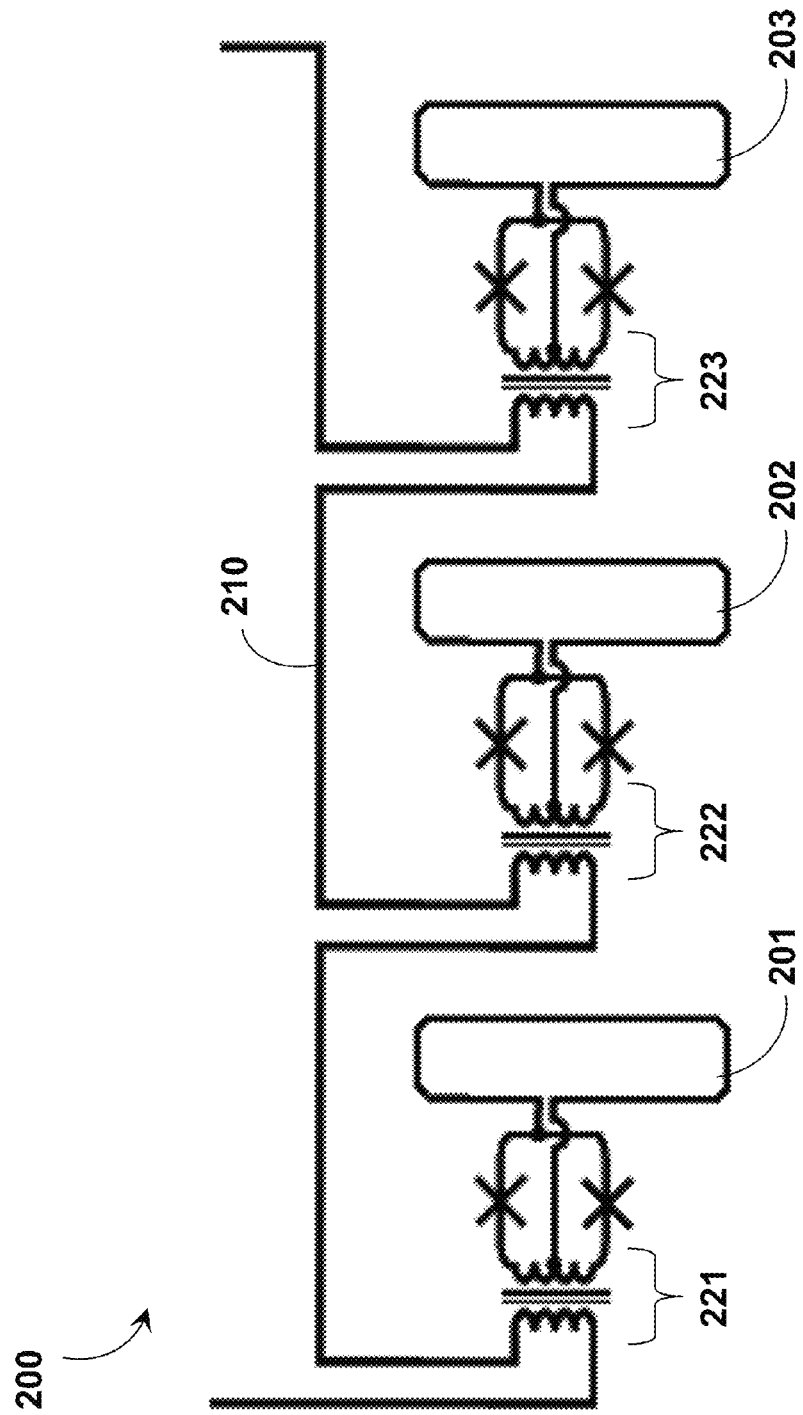
FIG. 2 is a schematic diagram of a superconducting integrated circuit including three superconducting flux qubits each having a respective CJJ that is inductively coupled to the same input signal line through a respective flux transformer.

FIG. 2 is a schematic diagram of a superconducting integrated circuit 200 including three superconducting flux qubits 201-203 each having a respective CJJ that is inductively coupled to the same input signal line 210 through a respective flux transformer 221-223. Each of flux transformers 221-223 comprises a respective pair of inductive coupling elements. Those of skill in the art will appreciate that the structure and components of qubits 201-203 have been simplified for the purposes of FIG. 2 and superconducting integrated circuit 200 may include additional components and devices that are not shown. Even though each of qubits 201-203 is inductively coupled to the same input signal line 210, the magnitude of the signal that each qubit actually receives from any given signal carried by input signal line 210 depends, at least in part, on the respective mutual inductance in each of flux transformers 221-223. For example, if flux transformer 221 achieves a mutual inductance of $M_1$ and flux transformer 222 achieves a mutual inductance of $M_2$, where $M_2$ is greater than $M_1$, then (all other things being equal) qubit 202 will receive a signal of a greater magnitude than that received by qubit 201 for any given signal carried by input signal line 210. In applications where it is desired that qubits 201-203 all receive substantially the same magnitude of signal for any given signal carried by input signal line 210, it is advantageous for the respective mutual inductances in flux transformers 221-223 to be substantially similar to one another. As previously described, the mutual inductance in a flux transformer (such as any of flux transformers 221-223) may depend, at least in part, on the size of the gap between the two inductors.

A superconducting integrated circuit may be made up of multiple layers, some of which may be metal layers providing superconducting current paths and some of which may be dielectric layers providing structural support and electrical isolation between adjacent metal layers. In such a circuit, a flux transformer may be realized by inductively coupling a first inductive coupling element embodied by a first superconducting current path disposed in a first metal layer to a second inductive coupling element embodied by a second superconducting current path disposed in a second metal layer, where the first and second metal layers are separated by a dielectric layer. Throughout the remainder of this specification, this geometry is referred to as the "parallel inductors" geometry, though those of skill in the art will appreciate that the term "parallel" is used loosely in this context and the two inductors may be slightly off-parallel.

Figure 3:
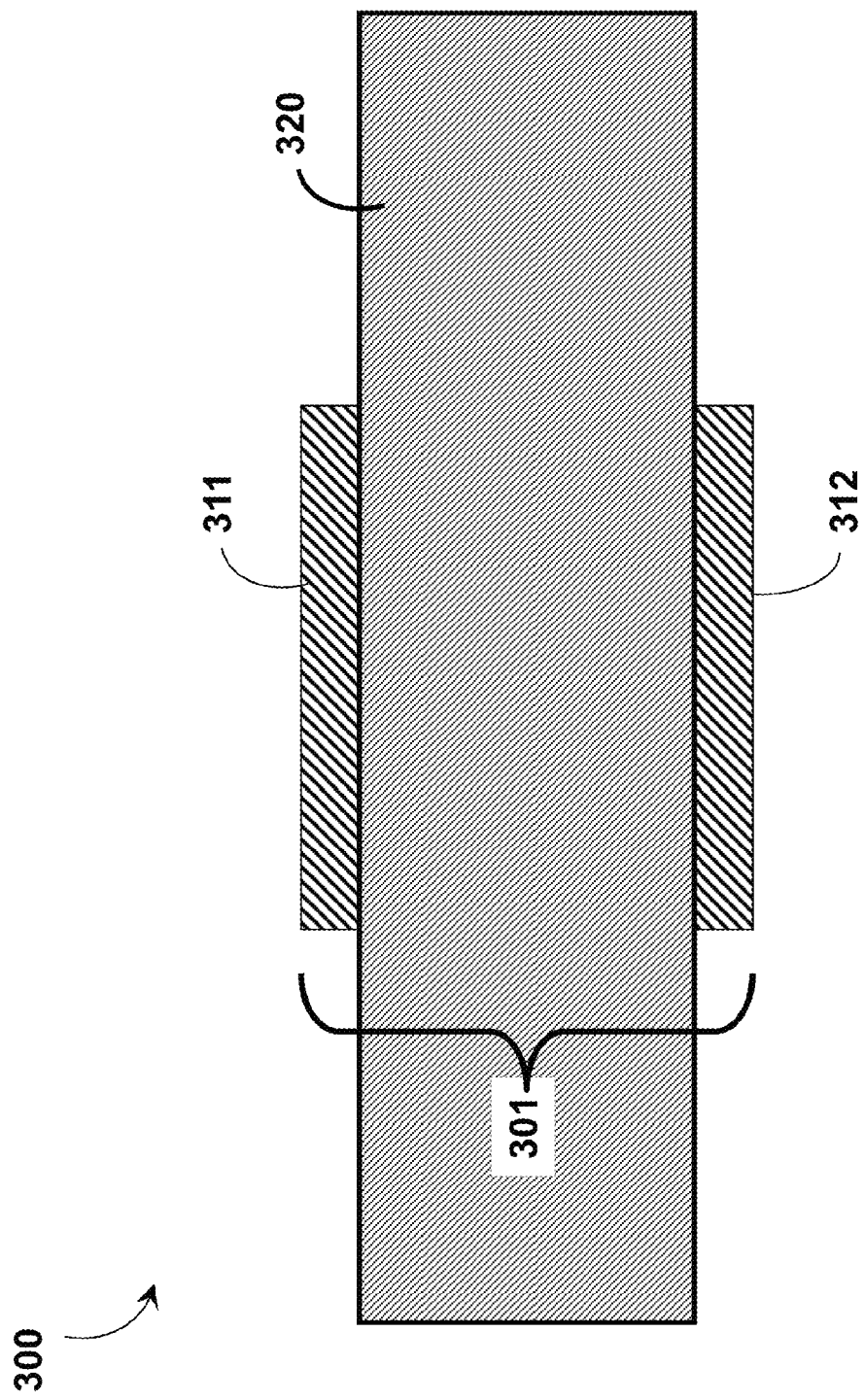
FIG. 3 is a sectional view of a multi-layered superconducting integrated circuit showing a flux transformer.

FIG. 3 is a sectional view of a multi-layered superconducting integrated circuit 300 showing a flux transformer 301 employing the "parallel inductors" geometry. Flux transformer 301 enables inductive coupling between a first superconducting current path 311 carried in a first metal layer and a second superconducting current path 312 carried in a second metal layer, where the first and second metal layers are separated from one another by a dielectric layer 320. The size of the gap that separates superconducting current paths 311 and 312 is determined by the thickness of the dielectric layer 320; thus, the mutual inductance in flux transformer 301 is dependent, at least in part, on the thickness of dielectric layer 320. In most applications, superconducting integrated circuit 300 will have been designed with a specific nominal thickness of dielectric layer 320 in mind and accordingly a specific nominal mutual inductance in flux transformer 301 will be expected. Any discrepancy between the designed nominal thickness of dielectric layer 320 and the actual fabricated thickness of dielectric layer 320 may result in a discrepancy between the designed nominal mutual inductance in flux transformer 301 and the actual mutual inductance achieved in flux transformer 301. As previously stated, such a discrepancy can typically be overcome in the operation of a single transformer (e.g., by scaling the applied signals), but can be detrimental in situations where it is desired that multiple flux transformers achieve a substantially similar mutual inductance at the same time. Two examples of how such discrepancies can arise between multiple flux transformers employing the "parallel inductors" geometry are illustrated in FIGS. 4 and 5.

Figure 4:
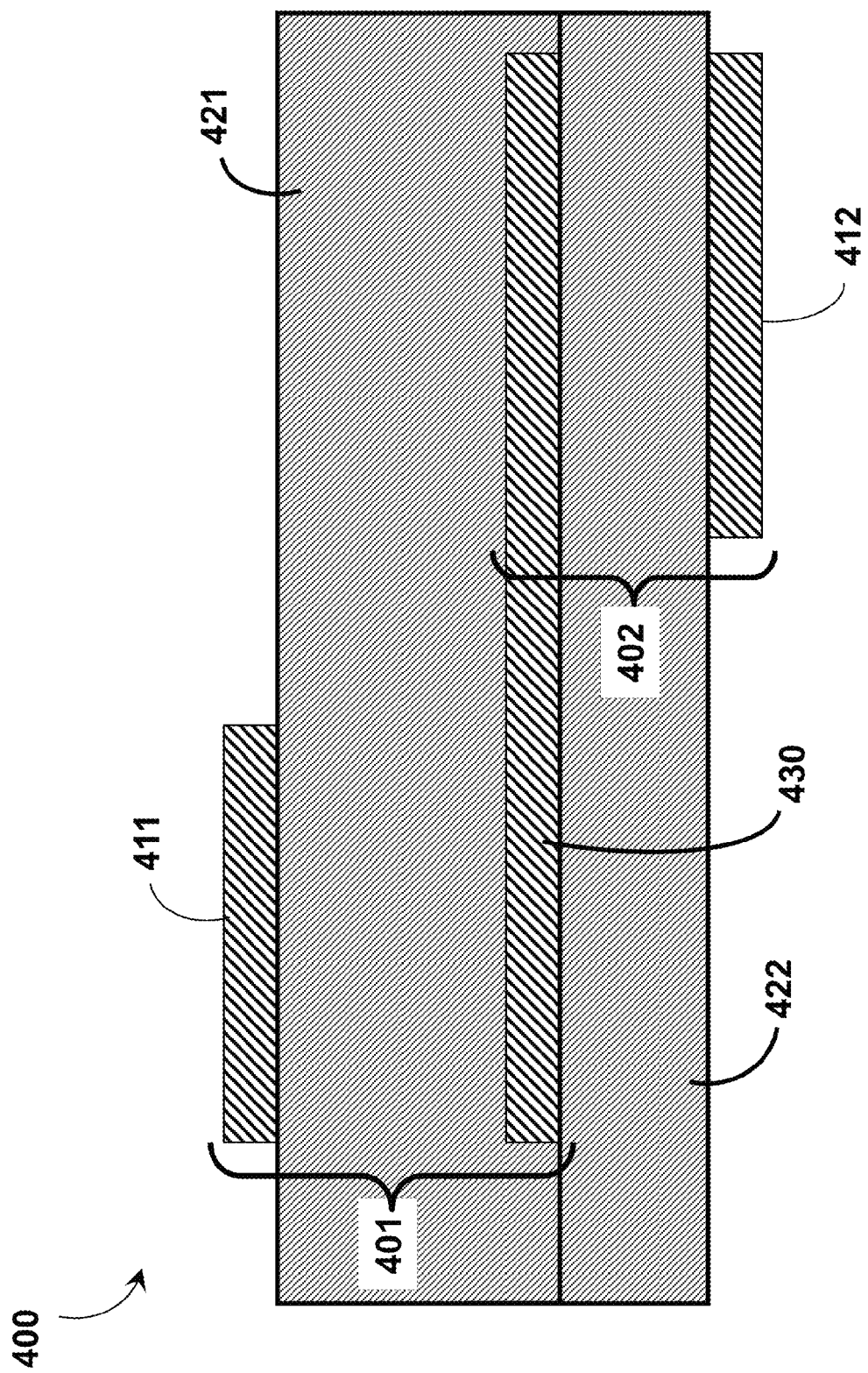
FIG. 4 is a sectional view of a multi-layered superconducting integrated circuit showing a first flux transformer in which the two superconducting current paths are separated by a first dielectric layer and a second flux transformer in which the two superconducting current paths are separated by a second dielectric layer.

FIG. 4 is a sectional view of a multi-layered superconducting integrated circuit 400 showing a first flux transformer 401 in which the two inductive coupling elements 411, 430 are separated by a first dielectric layer 421 and a second flux transformer 402 in which the two inductive coupling elements 430, 412 are separated by a second dielectric layer 422. In this illustrative example, dielectric layers 421 and 422 were both designed to have the same nominal thickness as one another in order to achieve substantially the same nominal mutual inductance in each of flux transformers 401 and 402.

However, due to some imperfection in the fabrication process, dielectric layer 421 has been made thicker than dielectric layer 422 (or, from the alternative point of view, dielectric layer 422 has been made thinner than dielectric layer 421). If all other things are held equal, flux transformer 401 will have a smaller actual mutual inductance than flux transformer 402 even though they were both designed to have the same nominal mutual inductance. Furthermore, because an inductive coupling element (430) in flux transformer 401 is galvanically coupled to an inductive coupling element (430) in flux transformer 402, it is particularly difficult to accommodate the discrepancy between their respective mutual inductances in the operation of superconducting integrated circuit 400. Any signal adjustments designed to accommodate the actual mutual inductance of flux transformer 401 will also be seen by flux transformer 402, and vice versa.

Figure 5:
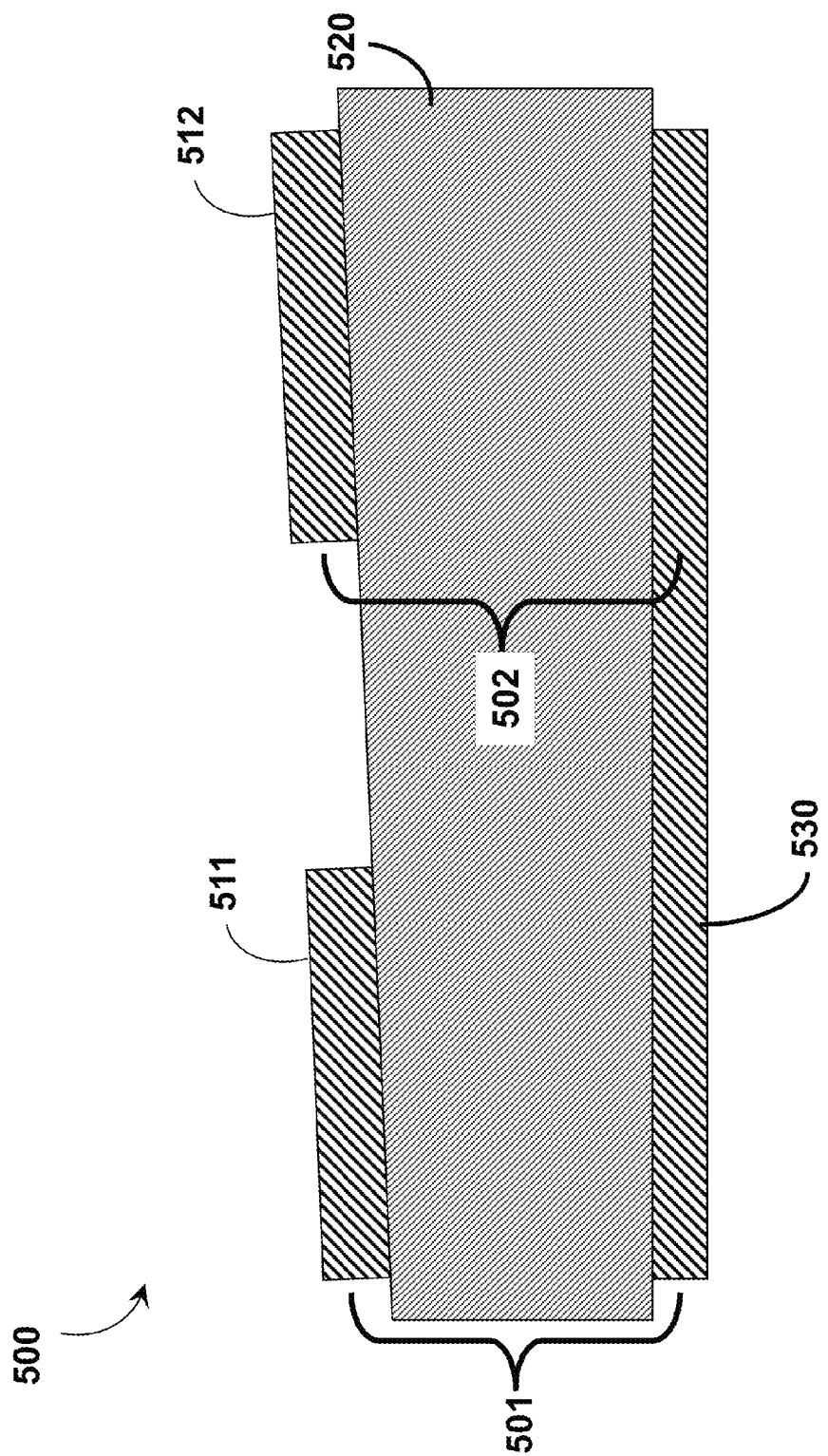
FIG. 5 is a sectional view of a multi-layered superconducting integrated circuit showing a first flux transformer in which the two superconducting current paths are separated by dielectric layer and a second flux transformer in which the two superconducting current paths are separated by the same dielectric layer.

FIG. 5 is a sectional view of a multi-layered superconducting integrated circuit 500 showing a first flux transformer 501 in which the two inductive coupling elements 511, 530 are separated by dielectric layer 520 and a second flux transformer 502 in which the two inductive coupling elements 512, 530 are separated by the same dielectric layer 520. In this illustrative example, dielectric layer 520 was designed to have a substantially uniform nominal thickness in order to achieve substantially the same nominal mutual inductance in each of flux transformers 501 and 502. However, due to some imperfection in the fabrication process, the actual thickness of dielectric layer 520 is not uniform and flux transformer 501 sees a thinner dielectric layer than flux transformer 502. If all other things are held equal, flux transformer 501 will have a larger actual mutual inductance than flux transformer 502 even though they were both designed to have the same nominal mutual inductance. Furthermore, because an inductive coupling element (530) in flux transformer 501 is galvanically coupled to an inductive coupling element (530) in flux transformer 502, it is particularly difficult to accommodate the discrepancy between their respective actual mutual inductances simultaneously in the operation of superconducting integrated circuit 500.

In accordance with the present systems and methods, the mutual inductance in a flux transformer may be made more robust against fabrication discrepancies by implementing a coaxial-like geometry. In some embodiments, a "coaxial flux transformer" may comprise a first inductive coupling element formed by an inner superconducting current path carried in a first metal layer of a superconducting integrated circuit and a second inductive coupling element formed by an outer superconducting current path that completely encircles the inner superconducting current path along at least a portion of a length of the inner superconducting path.

Figure 6:
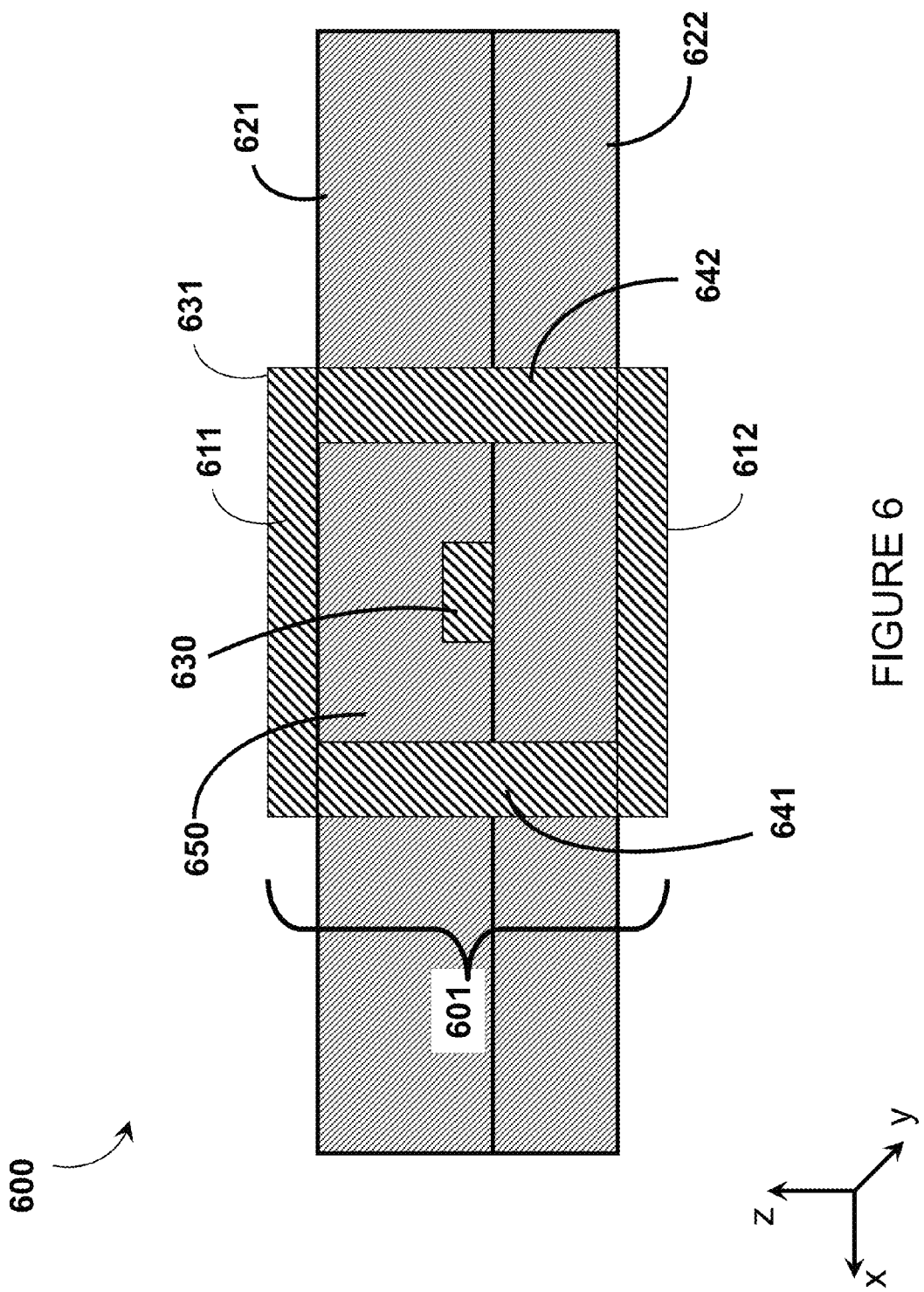
FIG. 6 is a sectional view of a multi-layered superconducting integrated circuit showing a coaxial flux transformer in accordance with an embodiment of the present systems and methods.

FIG. 6 is a sectional view of a multi-layered superconducting integrated circuit 600 showing a coaxial flux transformer 601 in accordance with an embodiment of the present systems and methods. Coaxial flux transformer 601 is similar to flux transformer 301 from FIG. 3 in that it includes inductive coupling elements that are inductively coupled to one another. Flux transformer 301 employs the "parallel inductor" geometry in which the two inductive coupling elements 311 and 312 are positioned parallel to one another on either side of a dielectric layer 320. Conversely, flux transformer 601 employs a coaxial-like geometry in which an inner superconducting current path 630 is encircled by an outer superconducting current path 631. The outer superconducting current path 631 is a closed superconducting loop and may, for example, be formed by a first superconducting current path 611 carried in a first metal layer, a second superconducting current path 612 carried in a second metal layer, and at least two superconducting connections 641, 642 therebetween. In flux transformer 301 from FIG. 3, signals may be coupled inductively between parallel superconducting current paths 311 and 312; whereas in coaxial flux transformer 601 from FIG. 6, signals may be coupled inductively between inner superconducting current path 630 and the outer superconducting current path 631 formed by superconducting current paths 611, 612, 641 and 642. By implementing a coaxial-like geometry in a flux transformer, the mutual inductance achieved becomes less sensitive (e.g., in some embodiments, sub-linearly sensitive, such as logarithmically sensitive) to variations in the size of the gap between the conductors. A coaxial transformer is, therefore, more robust against fabrication discrepancies than the common "parallel inductors" geometry shown in FIGS. 3-5.

As illustrated, superconducting integrated circuit 600 includes three metal layers and two dielectric layers, though those of skill in the art will appreciate that the present systems and methods may be adapted to accommodate different numbers of layers. Coaxial flux transformer 601 includes a first ("inner") superconducting current path 630 that is disposed in a first metal layer, where the first metal layer is carried on a first dielectric layer 622. Inner superconducting current path 630 is positioned to at least partially overlie a second superconducting current path 612 carried in a second metal layer, where inner superconducting current path 630 and second superconducting current path 612 are separated from one another by the first dielectric layer 622. A second dielectric layer 621 is disposed on top of the first metal layer such that inner superconducting current path 630 is positioned in between two dielectric layers 622 and 621. A third superconducting current path 611 is carried in a third metal layer that is disposed on the second dielectric layer 621. Third superconducting current path 611 is positioned such that at least a portion overlies at least a portion of both the first ("inner") and second superconducting current paths, 630 and 612, respectively. At least two superconducting connections 641 and 642 are established between the second superconducting current path 612 carried in the second metal layer and the third superconducting current path 611 carried in the third metal layer. In some embodiments, each of superconducting connections 641 and 642 may be comprised of at least one superconducting via. However, those of skill in the art will appreciate that because each of superconducting connections 641 and 642 extends through two dielectric layers, each of superconducting connections 641 and 642 may comprise multiple superconducting vias. For example, superconducting connection 641 may comprise a first superconducting via connecting the first and second metal layers through dielectric layer 622 and a second superconducting via connecting the first and third metal layers through dielectric layer 621. In various embodiments, multiple superconducting vias (e.g., forming a single superconducting connection 641) may be stacked directly on top of one another or, alternatively, offset from one another to form a staggered stairway-like configuration.

FIG. 6 is a sectional view of superconducting integrated circuit 600 cut along an xz-plane, where each of the metal layers and dielectric layers 621 and 622 lies in a respective xy-plane. For example, superconducting current path 611 is carried in a first metal layer in a first xy-plane and superconducting current path 612 is carried in a second metal layer in a second xy-plane. Superconducting current path 611 overlies superconducting current path 612 and there are at least two superconducting connections 641, 642 therebetween such that superconducting current path 611, superconducting current path 612, and the first and second superconducting connections 641, 642 together form a closed superconducting loop in an xz-plane. The xz-plane is orthogonal to the xy-planes and the closed superconducting loop defines an enclosed area 650 in the xz-plane. This closed superconducting loop in the xz-plane is a first inductive coupling element in coaxial flux transformer 601 and is analogous to the outer conductor in a coaxial cable. The second inductive coupling element is provided by superconducting current path 630 which is carried in a third metal layer in a third xy-plane positioned in between the first and second xy-planes. In coaxial flux transformer 601, superconducting current path 630 is analogous to the inner conductor in a coaxial cable. Superconducting current path 630 extends in the third xy-plane through the enclosed area 650 defined by the closed superconducting loop in the xz-plane. Thus, coaxial flux transformer 601 embodies a coaxial-like geometry where superconducting current path 630 is configured to inductively couple a signal to the closed superconducting loop by which it is encircled.

Those of skill in the art will appreciate that, throughout this specification and the appended claims, the terms "coaxial" and "coaxial-like" are used to generally describe a geometry in which an inner conductor is encircled along at least a portion of a length thereof by an outer conductor. In the art, a coaxial cable typically employs a circular cross section, with the inner conductor being axially-aligned (i.e., arranged concentrically) within the outer conductor. However, as used herein, the terms "coaxial" and "coaxial-like" are used in an approximate sense to describe a geometry in which the inner and outer conductors are designed to be approximately coaxially-aligned with one another within design and/or fabrication tolerances. It is an aspect of the present systems and methods that the mutual inductance in a "coaxial" transformer is inherently robust (compared to a "parallel inductors" transformer) against discrepancies between the designed coaxial alignment and the actual coaxial alignment between the inner and outer conductors. The terms "coaxial" and "coaxial-like" are not intended to limit embodiments of the present systems and methods to circular geometries. For example, coaxial flux transformer 601 in FIG. 6 employs a rectangular cross section where inner superconducting current path 630 may not be precisely centrally-aligned within the outer superconducting current path (defined by the closed superconducting loop in the xz-plane). The inner superconducting current path 630 is spatially separated (and electrically isolated) from the outer superconducting current path 631 and this "coaxial-like" geometry makes the mutual inductance between the inner superconducting current path 630 and the outer superconducting current path 631 more robust against discrepancies between the designed spatial separation and the actual spatial separation achieved in fabrication. Similarly, this "coaxial-like" geometry makes multiple flux transformers more robust against discrepancies between their respective mutual inductances.

FIG. 7 shows a sectional view of an exemplary superconducting integrated circuit 700 employing two coaxial flux transformers 701 and 702. Coaxial flux transformer 701 employs a first inductive coupling element embodied by inner superconducting current path 731 and a second inductive coupling element embodied by an outer superconducting current path 741 that encircles inner superconducting current path 731. Coaxial flux transformer 702 employs a first inductive coupling element embodied by inner superconducting current path 732 and a second inductive coupling element embodied by an outer superconducting current path 742 that encircles inner superconducting current path 732. In this example, inner superconducting current path 731 is galvanically coupled (elsewhere in superconducting integrated circuit 700, not shown in FIG. 7) to inner superconducting current path 732. Furthermore, both coaxial flux transformers 701 and 702 were designed to achieve substantially the same nominal mutual inductance between their respective inner and outer superconducting conductors. However, due to a discrepancy between the respective thicknesses of the dielectric layers, the spatial separation between the inner 732 and outer 742 conductors in flux transformer 702 is much smaller than the spatial separation between the inner 731 and outer 741 conductors in flux transformer 701. In the case of the "parallel inductors" geometry employed in flux transformers 401 and 402 in FIG. 4, such a discrepancy in the spatial separations could translate to a detrimental discrepancy in actual mutual inductance between flux transformers 401 and 402. However, because flux transformers 701 and 702 both employ a coaxial-like geometry, their respective mutual inductances are less sensitive (e.g., in some embodiments, sub-linearly sensitive, such as logarithmically sensitive) to variations in the spatial separation between their respective inner and outer conductors. This means that, for any given variation in spatial separation, the resulting discrepancy in mutual inductance between flux transformers 701 and 702 is much less than the discrepancy in mutual inductance between flux transformers 401 and 402. For example, the superconducting integrated circuit 200 shown in FIG. 2 is more robust against discrepancies between the mutual inductance in flux transformers 221-223 if each of flux transformers 221-223 employs a coaxial-like geometry, such as the geometry illustrated in FIG. 6, as opposed to a "parallel inductors" geometry.

Figure 8A:
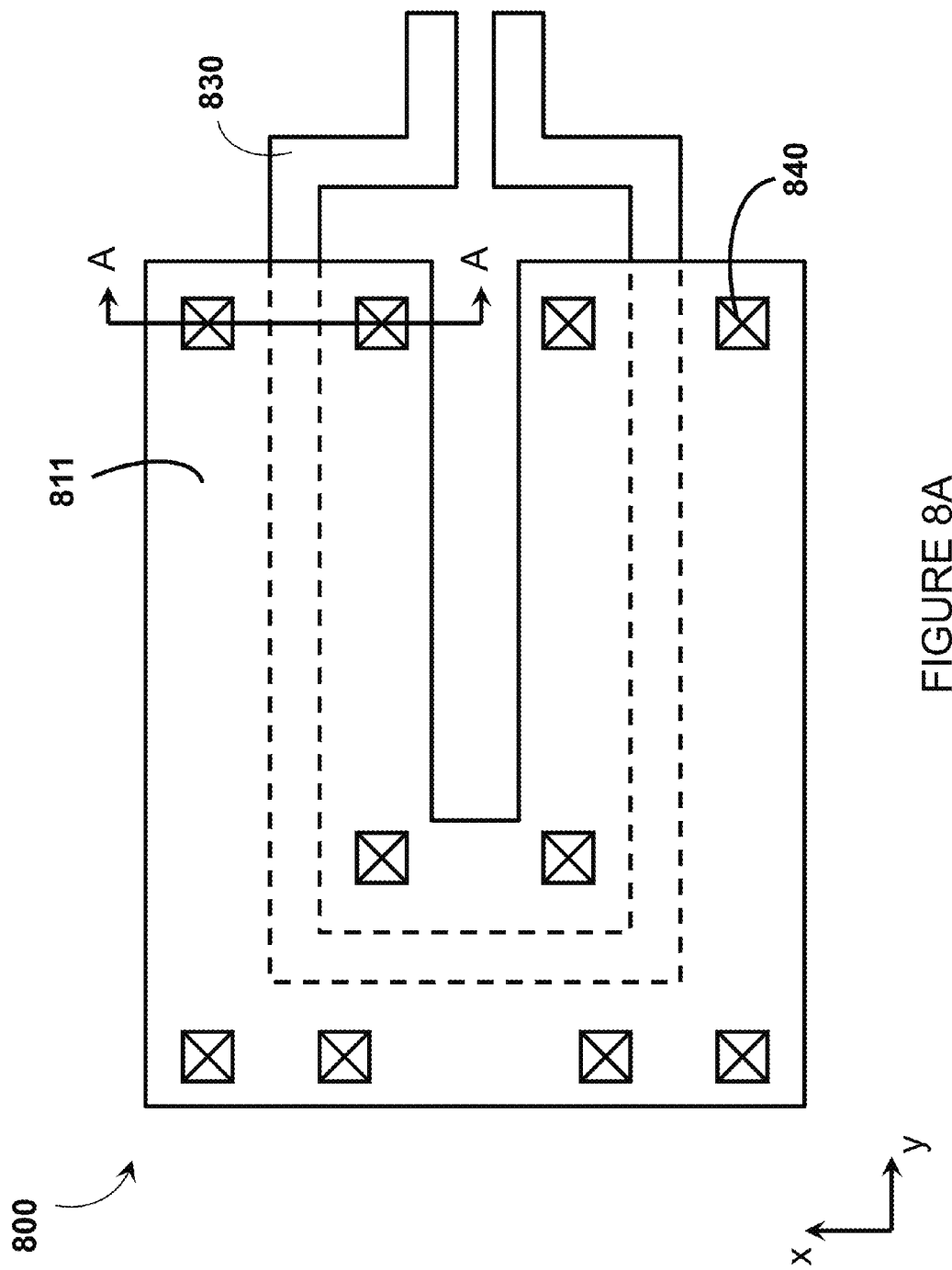
FIG. 8A is a top plan view of a coaxial flux transformer comprising multiple layers, with each layer corresponding to a respective xy-plane.

FIG. 8A is a top plan view of a coaxial flux transformer 800 comprising multiple layers, with each layer corresponding to a respective xy-plane. For clarity, dielectric layers are not shown in FIG. 8A. Transformer 800 includes a first inductive coupling element comprising an inner superconducting current path 830. Transformer 800 further includes a second inductive coupling element comprising a first "outer" superconducting current path 811, a second "outer" superconducting path (not visible), and superconducting connections 840 therebetween. In the illustrated embodiment, the first outer superconducting path 811 is substantially the same size and shape as the second outer superconducting path and the first outer superconducting path 811 directly overlies the second outer superconducting path (rendering the second outer superconducting path invisible in the top plan view of FIG. 8A). For reference, the second outer superconducting current path is shown in FIG. 8B.

Figure 8B:
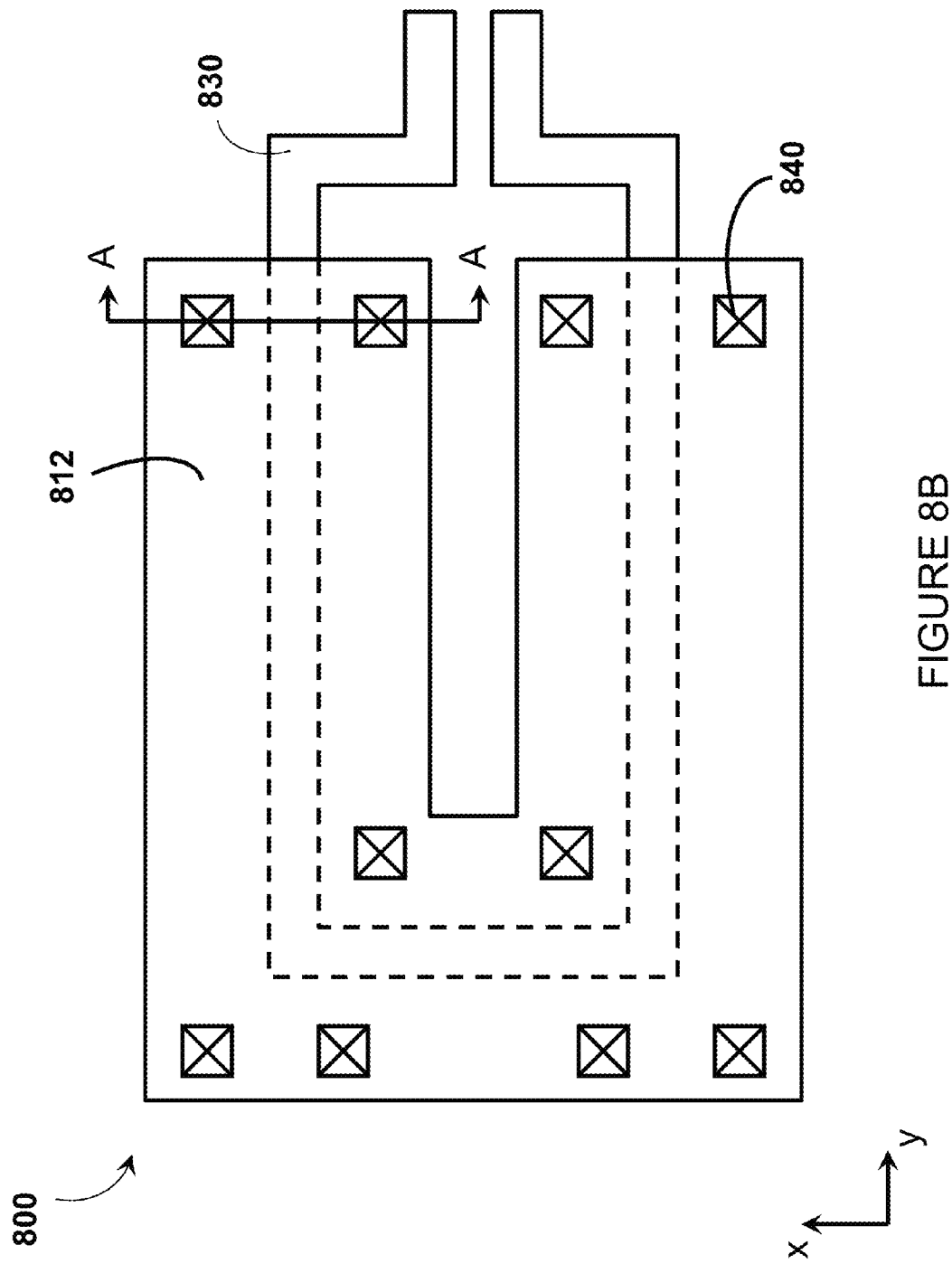
FIG. 8B is a bottom plan view of the coaxial flux transformer from FIG. 8A, showing a second "outer" superconducting current path.

FIG. 8B is a bottom plan view of coaxial flux transformer 800 showing the second "outer" superconducting current path 812. The second outer superconducting current path 812 is substantially the same size and shape as the first outer superconducting current path 811 from FIG. 8A but the two paths 811 and 812 are positioned in different xy-planes. For clarity, dielectric layers are not shown in FIG. 8B. With reference to both FIGS. 8A and 8B, inner superconducting current path 830 extends in between the two outer superconducting current paths 811 and 812 such that the first inductive coupling element is substantially axially-aligned with the second inductive coupling element. Superconducting connections between outer superconducting current paths 811 and 812 are realized through superconducting vias 840 (only one called out in the Figure) to define at least one closed superconducting loop that completely encircles inner superconducting current path 830 at one or more locations therealong. For example, a closed superconducting loop is formed at line A-A, a sectional view at which would resemble coaxial flux transformer 601 shown in FIG. 6. In the illustrated embodiment, superconducting current paths 811, 812, and 830 each forms a serpentine or "U-shape" in order to accommodate spatial restrictions in the rest of the superconducting integrated circuit (not shown). Those of skill in the art will appreciate that a coaxial flux transformer may employ superconducting current paths that embody any alternative layout, such as a straight line, a right-angled "L-shape", an acute or obtuse angle, a spiral, and so on. Furthermore, those of skill in the art will appreciate that while transformer 800 is illustrated as employing ten superconducting vias 840, in practice any number of superconducting vias may similarly be employed. Those of skill in the art will appreciate that each of superconducting vias 840 may be formed of one or more vias (e.g., multiple stacked vias, or staggered stairway-like vias). For example, it may be advantageous to position superconducting vias 840 at least at opposite ends of the lengths of paths 811 and 812 in order to ensure that currents may travel along the full lengths of paths 811 and 812. Also for example, it may be advantageous to employ densely packed superconducting vias in order to increase inductive coupling between the inner superconducting current path 830 and the superconducting vias 840 themselves. Further, it may be preferable to employ long via-like trenches as illustrated in FIGS. 9A and 9B.

Figure 9A:
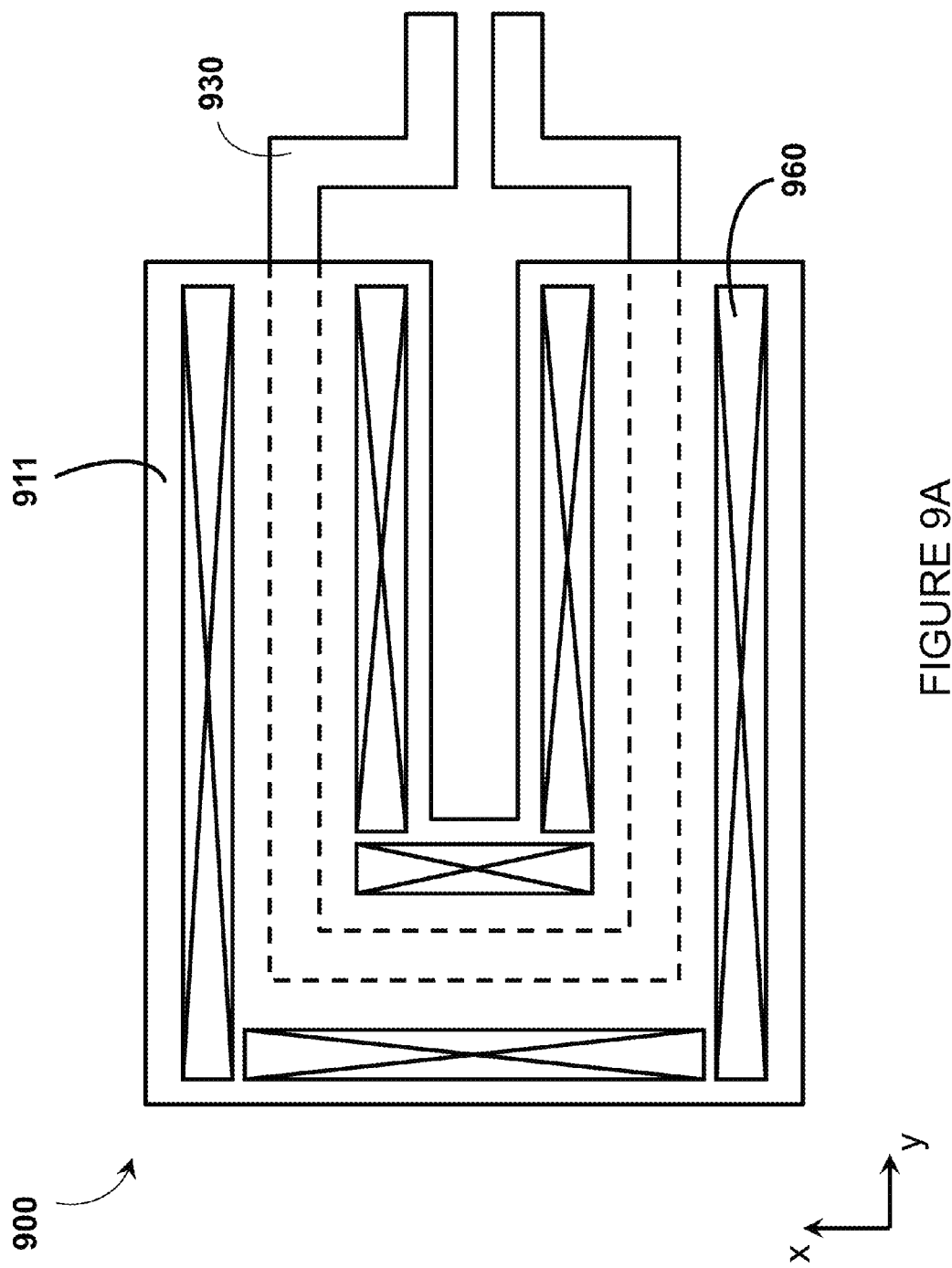
FIG. 9A is a top plan view of a coaxial flux transformer employing long via-like trenches as the superconducting connections between the two outer superconducting current paths.

FIG. 9A is a top plan view of a coaxial flux transformer 900 employing long via-like trenches 960 (only one called out in the Figure) as the superconducting connections between the two outer superconducting current paths. For clarity, dielectric layers are not shown in FIG. 9A. Transformer 900 includes a first "outer" superconducting current path 911 and a second "outer" superconducting path (not visible). In the illustrated embodiment, the first outer superconducting path 911 is substantially the same size and shape as the second outer superconducting path and the first outer superconducting path 911 directly overlies the second outer superconducting path (rendering the second outer superconducting path invisible in the top plan view of FIG. 9A). For reference, the second outer superconducting current path is shown in FIG. 9B.

Figure 9B:
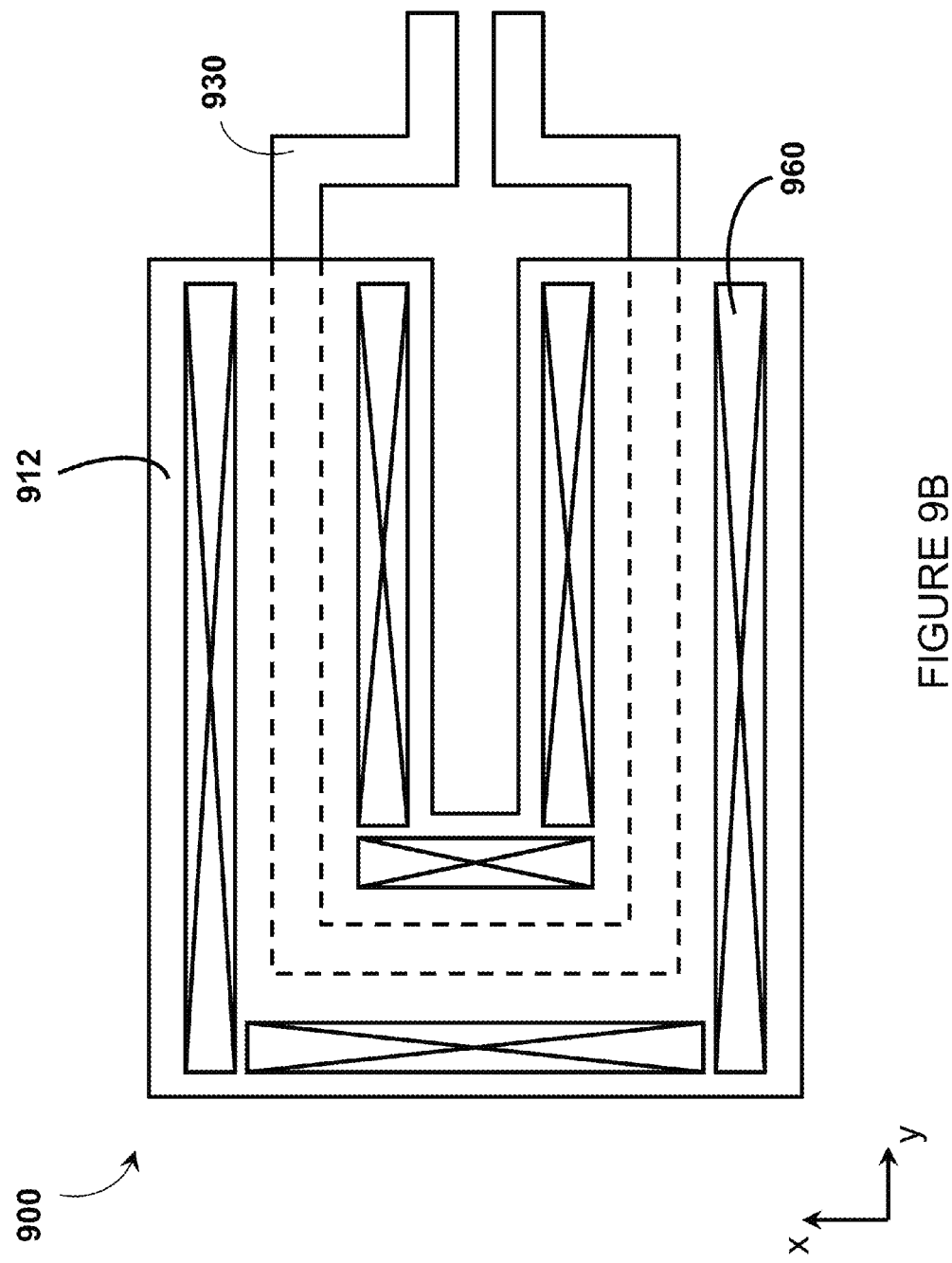
FIG. 9B is a bottom plan view of the coaxial flux transformer from FIG. 9A showing a second "outer" superconducting current path.

FIG. 9B is a bottom plan view of coaxial flux transformer 900 showing the second "outer" superconducting current path 912. The second outer superconducting current path 912 is substantially the same size and shape as the first outer superconducting current path 911 from FIG. 9A, but the two paths 911 and 912 are positioned in different xy-planes. For clarity, dielectric layers are not shown in FIG. 9B. With reference to both FIGS. 9A and 9B, each of trenches 960 is analogous to an elongated via that effectively forms a wall in a yz-plane to better enclose the inner superconducting current path 930. While six long via-like trenches 960 are illustrated in FIGS. 9A and 9B, those of skill in the art will appreciate that any number of trenches 960 may similarly be used. For example, if trenches 960 are capable of including a 90° turn, then transformer 900 may employ only two trenches 960 (one respectively positioned on either side of superconducting current path 930).

As illustrated in FIGS. 1-5, a flux transformer employing a "parallel inductors" geometry has two inductive coupling elements: a first inductor and a second inductor positioned sufficiently proximate the first inductor to realize a mutual inductance therebetween. Similarly, in some embodiments of the present systems and methods, a coaxial flux transformer may be considered to comprise two inductive coupling elements: an inner conductor and an outer conductor, where the outer conductor is formed by two coplanar current paths and conductive connections therebetween such that at least a portion of the outer conductor encircles at least a portion of the inner conductor. In some applications, the inner conductor may embody a signal input structure and the outer conductor may embody a signal receiver. In other applications, the outer conductor may embody a signal input structure and the inner conductor may embody a signal receiver. In either case, the signal input structure may include, for example, an input signal line and the signal receiver may be coupled to, for example, a programmable device.

Figure 10:
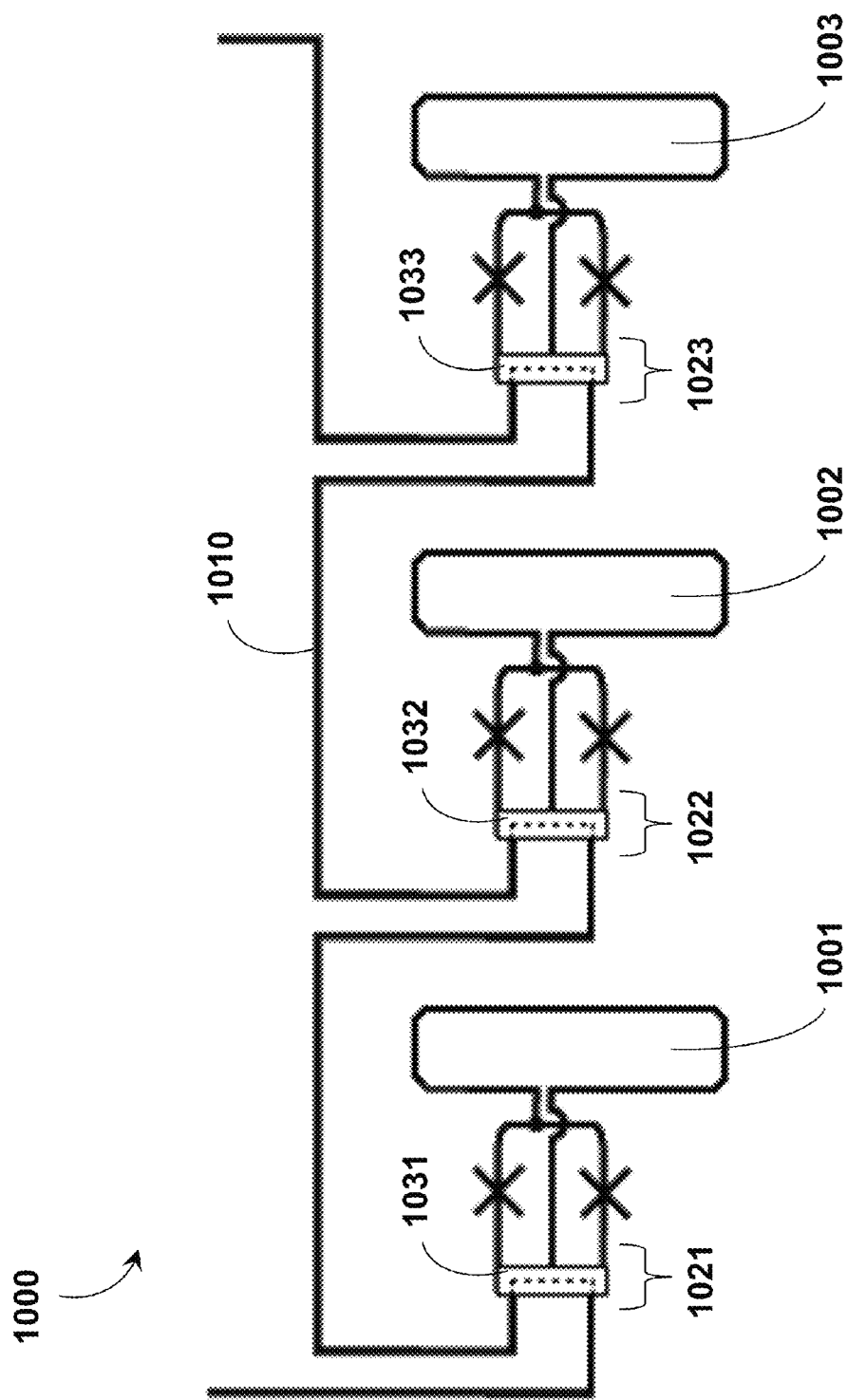
FIG. 10 is a schematic diagram of a superconducting integrated circuit including three programmable devices each having a respective signal receiver that is inductively coupled to the same input signal line.

FIG. 10 is a schematic diagram of a superconducting integrated circuit 1000 including three programmable devices 1001-1003 each having a respective signal receiver 1031-1033 that is inductively coupled to the same input signal line 1010. For each programmable device 1001-1003, the inductive coupling between the input signal line 1010 and the signal receiver 1031-1033, respectively, embodies a respective coaxial flux transformer 1021-1023 with the input signal line 1010 serving as the inner conductor and each signal receiver 1031-1033 serving as a respective outer conductor. However, those of skill in the art will appreciate that, in an alternative embodiment, each (or any one) of coaxial flux transformers 1021-1023 may employ the input signal line 1010 as the outer conductor and the signal receiver 1031-1033 as the inner conductor. In the illustrated embodiment, each of programmable devices 1001-1003 corresponds to a respective superconducting flux qubit in, for example, a superconducting quantum processor.

Figure 11:
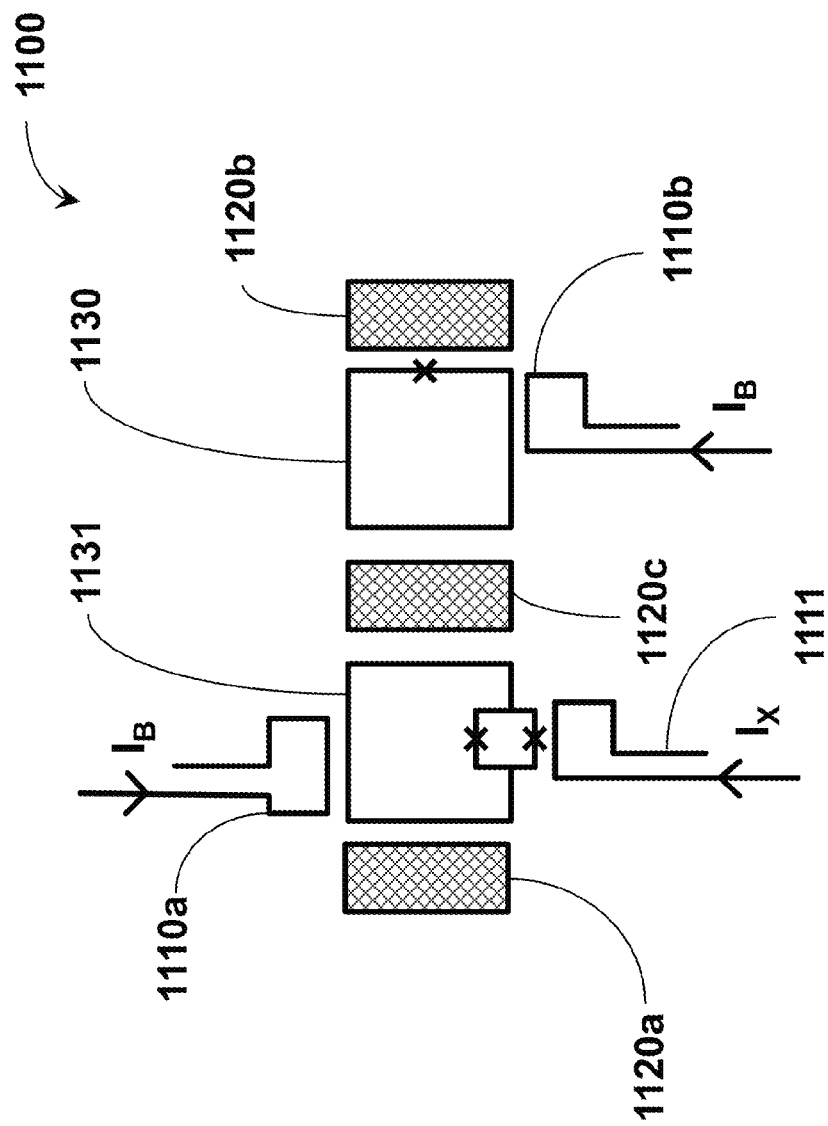
FIG. 11 is a schematic diagram showing a portion of an analog processor in the form of a quantum processor in accordance with an embodiment of the present systems and methods.

FIG. 11 shows one example of a portion 1100 of an analog processor in the form of a quantum processor. Quantum processor portion 1100 includes two superconducting qubits 1130 and 1131. The two superconducting qubits include an rf-SQUID qubit 1130 and an rf-SQUID qubit 1131 with a compound junction (where a single Josephson junction is replaced by two parallel Josephson junctions). A coupling device 1120c may couple qubits 1130 and 1131 together. Additional coupling devices 1120a and 1120b may couple qubits 1130 and 1131 to other qubits or devices (not shown). Qubits 1130 and 1131 may include a corresponding local bias device 1110a and 1110b, respectively. Qubit 1131 may further include a compound Josephson junction bias device 1111 which controls the tunneling rate of superconducting qubit 1130. Quantum processor portion 1100 is extendable to form, for example, an interconnected topology. In an embodiment, a quantum processor may include a plurality of superconducting devices, such as superconducting qubits 1130 and 1131, and one or more associated coupling devices 1120a, 1120b, and 1120c. Quantum processor may further include one or more local bias devices 1110a and 1110b and one or more compound Josephson junction bias devices 1111. In an embodiment, quantum processor may include at least two qubits in the form of qubit 1130 or qubit 1131, at least one coupling device in the form of 1120a, 1120b, or 1120c, and at least one local bias device in the form of 1110a or 1110b.

Examples of superconducting qubits include superconducting flux qubits, superconducting charge qubits, and the like. See e.g., Makhlin et al., 2001, Reviews of Modern Physics 73, pp. 357-400. Examples of flux qubits that may be used include rf-SQUIDs, which include a superconducting loop interrupted by one Josephson junction, persistent current qubits, which include a superconducting loop interrupted by three Josephson junctions, and the like. See e.g., Mooij et al., 1999, Science 285, p. 1036; and Orlando et al., 1999, Phys. Rev. B 60, 15398. Other examples of superconducting qubits can be found, for example, in Il'ichev et al., 2003, Phys. Rev. Lett. 91, 097906; Blatter et al., 2001, Phys. Rev. B 63, 174511, and Friedman et al., 2000, Nature 1106, p. 113.

Superconducting coupling devices that may be used in the present devices and methods include rf-SQUIDs and dc-SQUIDs, which couple qubits together by flux. As described previously, SQUIDs include a superconducting loop interrupted by one Josephson junction (an rf-SQUID) or two Josephson junctions (a dc-SQUID). Coupling devices 1120a, 1120b, 1120c may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Local bias devices 1110a, 1110b may include a metal loop in proximity to a superconducting qubit that provides an external flux bias to the qubit. Local bias device 1110a, 1110b may also include a plurality of Josephson junctions. Again, each superconducting qubit in quantum processor may have a corresponding local bias device or there may be fewer local bias devices than qubits 172.

There may exist readout devices, such as dc-SQUIDs, able to determine the quantum state of superconducting qubit 1130, 1131. Each superconducting qubit 1130, 1131 in quantum processor may have a corresponding readout device or, alternatively, there may be fewer readout devices than qubits 1130, 1131.

Certain aspects of the present systems and methods may be realized at room temperature, and certain aspects may be realized at a superconducting temperature. Thus, throughout this specification and the appended claims, the term "superconducting" when used to describe a physical structure such as a "superconducting current path" is used to indicate a material that is capable of behaving as a superconductor at an appropriate temperature. A superconducting material may not necessarily be acting as a superconductor at all times in all embodiments of the present systems and methods. It is also noted that the teachings provided herein may be applied in non-superconducting applications, such as in radio frequency transformers formed out of gold.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems and methods of quantum computation, not necessarily the exemplary systems and methods for quantum computation generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 61/295,561, filed Jan. 15, 2010, and entitled "Systems And Methods For Superconducting Integrated Circuits," U.S. patent application Ser. No. 12/944,518, filed Nov. 11, 2010, U.S. Pat. No. 7,533,068, US Patent Publication 2008-0176750, US Patent Publication 2009-0121215, and PCT Patent Application Serial No. PCT/US2009/037984 (Publication WO2009/120638), are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting integrated circuit comprising:
    a superconducting signal line;
    a first conductor part of a coaxial flux transformer interrupting the signal line; and
    a programmable device including:
        a loop of superconducting material, and
        a second conductor part of the coaxial flux transformer coupled to the loop of superconducting material wherein the first conductor part of the coaxial flux transformer is in a coaxial arrangement to the second conductor part of the coaxial flux transformer.

2. The superconducting integrated circuit of claim 1 wherein the programmable device is a superconducting flux qubit.

3. The superconducting integrated circuit of claim 1 wherein the programmable device is a coupling device.

4. The superconducting integrated circuit of claim 1 wherein the second conductor part of the coaxial flux transformer interrupts the loop of superconducting material.

5. The superconducting integrated circuit of claim 1 further comprising a compound Josephson junction interrupting the loop of superconducting material and wherein the second conductor part of the coaxial flux transformer interrupts the compound Josephson junction.

6. The superconducting integrated circuit of claim 1 wherein the coaxial arrangement suppresses an effect of any fabrication discrepancies on a mutual inductance between the first conductor part of the coaxial flux transformer and the second conductor part of the coaxial flux transformer.

7. The superconducting integrated circuit of claim 6 wherein the mutual inductance between the first conductor part of the coaxial flux transformer and the second conductor part of the coaxial flux transformer is sub-linearly proportional to a distance that separates between the first conductor part of the coaxial flux transformer and the second conductor part of the coaxial flux transformer.

8. The superconducting integrated circuit of claim 1 wherein:
    the first conductor part of the coaxial flux transformer is an inner conductor, and
    the second conductor part of the coaxial flux transformer is an outer conductor.

9. The superconducting integrated circuit of claim 1 wherein:
    the first conductor part of the coaxial flux transformer is an outer conductor, and
    the second conductor part of the coaxial flux transformer is an inner conductor.

10. The superconducting integrated circuit of claim 1 wherein the first conductor part of the coaxial flux transformer is spaced radially inwardly of the second conductor part of the coaxial flux transformer.

11. The superconducting integrated circuit of claim 1 wherein the first conductor part of the coaxial flux transformer is spaced radially outwardly of the second conductor part of the coaxial flux transformer.

12. A superconducting integrated circuit comprising:
    a superconducting signal line;

a plurality of programmable devices wherein each respective programmable device includes a respective signal receiver portion; and a plurality of coaxial flux transformers, wherein each coaxial flux transformers includes a respective conductor coupled to the signal line, wherein:

each respective conductor is in a coaxial arrangement with a respective signal receiver portion, to suppress an effect of any fabrication discrepancies on a mutual inductance between the respective conductor to the respective signal receiver portion.

13. The superconducting integrated circuit of claim 12 wherein the plurality of programmable devices are superconducting flux qubits.

14. The superconducting integrated circuit of claim 12 wherein the plurality of programmable devices are coupling devices.

15. The superconducting integrated circuit of claim 12 wherein the suppression of the effect of any fabrication discrepancies on the mutual inductance between the inner conductor and the outer conductor is a logarithmic suppression.

16. The superconducting integrated circuit of claim 12 wherein the respective signal receiver portion interrupts a body portion of the respective programmable devices.

17. The superconducting integrated circuit of claim 12 further comprising:

a plurality of compound Josephson junctions, wherein a respective compound Josephson junction interrupts a respective current path in the respective programmable devices; and wherein the respective signal receiver portion is included in the respective compound Josephson junction.

18. The superconducting integrated circuit of claim 12 wherein the respective signal receiver portion is an inner conductor in a respective coaxial flux transformer.

19. The superconducting integrated circuit of claim 12 wherein the respective signal receiver portion is an outer conductor in a respective coaxial flux transformer.

* * * * *